US012399225B2

(12) United States Patent
Wang et al.

(10) Patent No.: US 12,399,225 B2
(45) Date of Patent: Aug. 26, 2025

(54) BATTERY INTERNAL RESISTANCE DETECTING DEVICE AND BATTERY PRODUCTION SYSTEM

(71) Applicant: CONTEMPORARY AMPEREX TECHNOLOGY (HONG KONG) LIMITED, Hong Kong (CN)

(72) Inventors: Xiyue Wang, Fujian (CN); Longchang Sun, Fujian (CN); Hongpan Han, Fujian (CN); Ling Han, Fujian (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 184 days.

(21) Appl. No.: 18/217,611

(22) Filed: Jul. 3, 2023

(65) Prior Publication Data

US 2023/0349980 A1 Nov. 2, 2023

Related U.S. Application Data

(63) Continuation of application No. PCT/CN2023/083474, filed on Mar. 23, 2023.

(30) Foreign Application Priority Data

Apr. 15, 2022 (CN) .......................... 202220881672.8

(51) Int. Cl.
*G01R 31/36* (2020.01)
*G01R 31/389* (2019.01)

(52) U.S. Cl.
CPC ....... *G01R 31/389* (2019.01); *G01R 31/3644* (2013.01)

(58) Field of Classification Search
CPC .............. G01R 31/389; G01R 31/3644; G01R 31/1227; H01M 10/48; H01M 16/006;
(Continued)

(56) References Cited

U.S. PATENT DOCUMENTS

| 2011/0106280 A1* | 5/2011 | Zeier .................... H01M 10/425 700/90 |
| 2022/0135133 A1* | 5/2022 | Cai .......................... B60K 1/04 296/26.01 |

(Continued)

FOREIGN PATENT DOCUMENTS

| CN | 108548563 A | 9/2018 |
| CN | 109342965 A | 2/2019 |

(Continued)

OTHER PUBLICATIONS

International Search Report and Written Opinion issued Jul. 3, 2023, in corresponding International Patent Application No. PCT/CN2023/083474, 9pp.

(Continued)

*Primary Examiner* — Giovanni Astacio-Oquendo
*Assistant Examiner* — Trung Q Nguyen
(74) *Attorney, Agent, or Firm* — XSENSUS LLP

(57) ABSTRACT

The present application relates to a battery internal resistance detecting device and a battery production system. The battery internal resistance detecting device may comprise: a first probe used for electrically connecting to a positive electrode of a battery; and a second probe used for electrically connecting to a negative electrode of the battery; wherein a distance between the first probe and the second probe may be adjustable.

13 Claims, 5 Drawing Sheets

(58) Field of Classification Search
CPC ......... H01M 8/04671; H01M 2220/20; B60W 50/0205
USPC ...................... 324/500, 600, 76.11, 425–434
See application file for complete search history.

(56) References Cited

U.S. PATENT DOCUMENTS

| | | | | |
|---|---|---|---|---|
| 2022/0352592 | A1* | 11/2022 | Kim | .......................... G01B 5/30 |
| 2022/0365122 | A1* | 11/2022 | Kim | ..................... G01R 27/025 |
| 2023/0282870 | A1* | 9/2023 | Zheng | ............... H01M 10/0404 427/58 |
| 2023/0420722 | A1* | 12/2023 | Kim | ................. H01M 10/0404 |
| 2024/0313249 | A1* | 9/2024 | Bae | ....................... H01M 50/30 |

FOREIGN PATENT DOCUMENTS

| | | | |
|---|---|---|---|
| CN | 110346735 | A | 10/2019 |
| CN | 110794320 | A | 2/2020 |
| CN | 210805703 | U | 6/2020 |
| CN | 111487550 | A | 8/2020 |
| CN | 211505638 | U | 9/2020 |
| CN | 212207509 | U | 12/2020 |
| CN | 212872803 | U | 4/2021 |
| CN | 213182789 | U | 5/2021 |
| CN | 113533980 | A | 10/2021 |
| CN | 111874610 | B | 11/2021 |
| CN | 215204518 | U | 12/2021 |
| CN | 218412603 | U | 1/2023 |
| KR | 1998-030933 | A | 7/1998 |
| KR | 10-2005-0002233 | A | 1/2005 |

OTHER PUBLICATIONS

Notice of Grant of Utility Model Patent Right issued Nov. 14, 2022 in Chinese Utility Model Application No. 202220881672.8 with English translation thereof.

Extended European Search Report issued Jul. 18, 2024 in European Patent Application No. 23737849.2.

* cited by examiner

BATTERY INTERNAL RESISTANCE DETECTING DEVICE AND BATTERY PRODUCTION SYSTEM

CROSS-REFERENCE TO RELATED APPLICATIONS

The present application is a continuation of International Application No. PCT/CN2023/083474, filed Mar. 23, 2023, which claims priority to Chinese patent application (202220881672.8) filed on Apr. 15, 2022 and entitled "BATTERY INTERNAL RESISTANCE DETECTING DEVICE AND BATTERY PRODUCTION SYSTEM," each of which is incorporated herein by reference in its entirety.

TECHNICAL FIELD

The present application relates to the technical field of batteries, and specifically, to a battery internal resistance detecting device and a battery production system.

BACKGROUND ART

In related technologies, it is often necessary to detect an internal resistance of a battery through a battery internal resistance detecting device. In a scenario of batch detection, two probes of the battery internal resistance detecting device are generally fixed, and are only capable of being connected to a positive electrode and a negative electrode of a battery of one specification individually. As a result, only the internal resistance of a battery of one specification can be detected, and internal resistances of batteries of different specifications can't be detected.

SUMMARY OF THE DISCLOSURE

The present application aims to provide a battery internal resistance detecting device and a battery production system, for detecting internal resistances of batteries of different specifications.

The embodiments of the present application are realized in this way:

In the first aspect, an embodiment of the present application provides a battery internal resistance detecting device, comprising: a first probe used for electrically connecting to a positive electrode of a battery; and a second probe used for electrically connecting to a negative electrode of the battery; wherein a distance between the first probe and the second probe is adjustable.

In the above technical solution, by setting the distance between the first probe and the second probe to be adjustable, the distance between the first probe and the second probe may be adjusted conveniently according to a distance between the positive electrode and the negative electrode of the battery, so that the battery internal resistance detecting device is capable of detecting internal resistances of batteries of different specifications, thereby improving the applicability of the battery internal resistance detecting device.

In some embodiments of the present application, the battery internal resistance detecting device further comprises: a first base; a first bracket connected to the first base, the first probe being arranged on the first bracket; and a second bracket connected to the first base body and arranged opposite to the first bracket in a first direction, the second probe being arranged on the second bracket; wherein at least one of the first bracket and the second bracket is movable in the first direction, so that the distance between the first probe and the second probe is adjustable.

In the above technical solution, by moving the first bracket and/or the second bracket on the first base in the first direction, the distance adjustment between the two probes can be achieved, the overall structure is simple, and it is convenient to replace and maintain the probes.

In an embodiment of the present application, the first base has a plurality of through holes arranged in the first direction. The battery internal resistance detecting device further comprises: a first fixing member, the first bracket being optionally connected to the plurality of through holes through the first fixing member; and a second fixing member, the second bracket being optionally connected to the plurality of through holes through the second fixing member.

In the above technical solution, the first bracket and the second bracket are respectively fixed at different positions by passing the first fixing member and the second fixing member through different through holes to realize the distance adjustment between the first bracket and the second bracket, then realize the distance adjustment between the first probe and the second probe, and further be capable of ensuring that the first probe and the second probe are stable at a certain distance, thereby avoiding displacement of the first probe and the second probe, and ensuring that the first probe and the second probe are capable of being respectively connected to the positive electrode and the negative electrode of a battery to be detected.

In one embodiment of the present application, the first base is provided with a chute extending in the first direction, and the plurality of through holes are located at the bottom of the chute; the first bracket is provided with a first protrusion, the first protrusion is movably fitted in the chute, and the first fixing member passes through the first protrusion to be optionally connected to the plurality of through holes; and the second bracket is provided with a second protrusion, the second protrusion is movably fitted in the chute, and the second fixing member passes through the second protrusion to be optionally connected to the plurality of through holes.

In the above technical solution, by arranging the first protrusion on the first bracket and arranging the second protrusion on the second bracket to fit the chute, it is convenient to adjust the distance by sliding the first bracket and the second bracket, the structure is simple, and the operation is convenient. The first bracket and the second bracket are capable of being respectively fixed by the first fixing member and the second fixing member, so as to avoid the displacement of the first probe and the second probe and ensure the stability of the first probe and the second probe. Furthermore, it is ensured that the first probe and the second probe are capable of being respectively connected to the positive electrode and the negative electrode of the battery to be detected.

In an embodiment of the present application, the battery internal resistance detecting device further comprises: a frame body; an adjusting apparatus arranged on the frame body and connected to the first base, so as to adjust a position of the first base relative to the frame body.

Batteries of different specifications may have different positions of positive electrodes and negative electrodes, and therefore, in the above technical solution, by adjusting the position of the first base, the position adjustment of the first probe and the second probe is capable of being achieved so that the position of the first probe corresponds to the positive electrodes of the batteries of different specification, and the position of the second probe corresponds to the negative electrodes of the batteries of different specifications, which further facilitates the detection of the internal resistances of the batteries of different specifications.

In one embodiment of the present application, the adjusting apparatus comprises: a second base; a first guide rail arranged on the second base and extending in a second direction, the second direction being perpendicular to the first direction; a first slider arranged on the first guide rail and connected to the first base, the first slider being configured to be capable of moving along the first guide rail to adjust a position of the first base in the second direction; and a first driving member used for driving the first slider to move along the first guide rail.

In the above technical solution, by moving the first base in the second direction, the first probe and the second probe are capable of approaching the battery in the second direction and respectively contacting with the positive electrode and the negative electrode of the battery, or moving away from the battery in the second direction to be detached from the electrical connections with the positive electrode and the negative electrode of the battery, so that it is convenient to place the battery at a set position or take the battery away at the set position, and it is further convenient to detect the internal resistance of the battery.

In an embodiment of the present application, the first slider comprises a first part and a second part, the first part is connected to the first guide rail; the first base has a plurality of through holes arranged in the first direction; and the battery internal resistance detecting device further comprises: a third fixing member, the second part being optionally connected to the plurality of through holes through the third fixing member, so as to adjust a position of the first base in the first direction.

In the above technical solution, by optionally connecting the second part of the first slider to the plurality of through holes through the third fixing member, the position of the first base is capable of being adjusted relative to the first slider in the first direction. When the positions of the positive electrode and the negative electrode of the battery are different in the first direction, the position of the first base in the first direction is capable of being adjusted so that the first probe corresponds to the position of the positive electrode of the battery, and the second probe corresponds to the position of the negative electrode of the battery.

In an embodiment of the present application, the adjusting apparatus further comprises: a third base; and a second guide rail connected to the third base and extending in a third direction, the third direction being perpendicular to the first direction and the second direction, and the second base being movably connected to the second guide rail, so as to adjust a position of the first base in the third direction.

In the above technical solution, when the positions of the positive electrode and the negative electrode of the battery are different in the third direction, the position of the first base in the third direction is capable of being adjusted by moving the second base in the second direction, so that the first probe corresponds to the position of the positive electrode of the battery, and the second probe corresponds to the position of the negative electrode of the battery.

In an embodiment of the present application, the adjusting apparatus further comprises: a third guide rail arranged on the frame body and extending in the second direction, the third base being movably connected to the third guide rail.

When the specifications of the batteries are different, the batteries may have different sizes in the second direction. In the above technical solution, by arranged the third base on the third guide rail, when the third base is moved, the second base connected to the third base is capable of moving in the second direction, and driving the first base, the first probe, and the second probe to move in the second direction, so as to be capable of adjusting the positions of the first probe and the second probe in the second direction in advance, thereby further being convenient to detect batteries of different specifications.

In an embodiment of the present application, the frame body is provided with a channel for the battery to pass through; and the battery internal resistance detecting device further comprises: a stopping apparatus arranged on the frame body and located in the channel, the stopping apparatus being used for stopping the battery at a preset position.

In the above technical solution, by arranging the channel for the battery to pass through on the frame body, it is convenient to erect the frame body on a battery production line, so that the battery internal resistance detecting device can perform batch detection on the batteries on the battery production line. During the detection, the battery on the production line is intercepted by the stopping apparatus, so that the battery is stopped and positioned at a preset position, so that the first probe and the second probe are connected to the positive electrode and negative electrode of the battery to detect the internal resistance of the battery.

In one embodiment of the present application, the stopping apparatus comprises: a blocking member movably arranged on the frame body and having a retracted state and an extended state, the blocking member being capable of stopping the battery at the preset position in the extended state; and a second driving member arranged on the frame body, the second driving member being used for driving the blocking member to move to switch between the retracted state and the extended state.

In the above technical solution, by arranging the second driving member to drive the blocking member to move, the battery is automatically blocked and released, and the detection efficiency is improved.

In an embodiment of the present application, the battery internal resistance detecting device further comprises: a position detecting apparatus arranged on the frame body and located in the channel, the position detecting apparatus being used for detecting a position of the battery, and being configured to send a first signal when the battery reaches a preset position; and the stopping apparatus is configured to act in response to the first signal to stop the battery.

In the above technical solution, through the cooperation of the position detecting apparatus and the stopping apparatus, automatic stop is further realized, thereby avoiding missed detection and improving the detection efficiency.

In an embodiment of the present application, the battery internal resistance detecting device further comprises: a scanning apparatus, the scanning apparatus being used for scanning an identification on the battery to read information of the battery.

In the above technical solution, by arranging the scanning apparatus to read the information of the battery, a detection result is capable of matching the battery, thereby preventing the battery with an unqualified internal resistance detection result from flowing out.

In a second aspect, the embodiments of the present application further provide a battery production system, comprising the battery internal resistance detecting device according to any item in the first aspect.

In the above technical solution, the battery internal resistance detecting device of the battery production system is capable of detecting internal resistances of batteries of different specifications, and the battery production system is capable of being adapted to produce batteries of different specifications.

DESCRIPTION OF DRAWINGS

To more clearly describe the technical solutions of the embodiments of the present application, the drawings to be used in the embodiments will be briefly introduced below, and it should be understood that the following drawings only show some embodiments of the present application, and therefore should not be considered as limiting the scope of the present application. For those of ordinary skills in the art, other relevant drawings may also be obtained based on these drawings without creative efforts.

DETAILED DESCRIPTION

Figure 1:
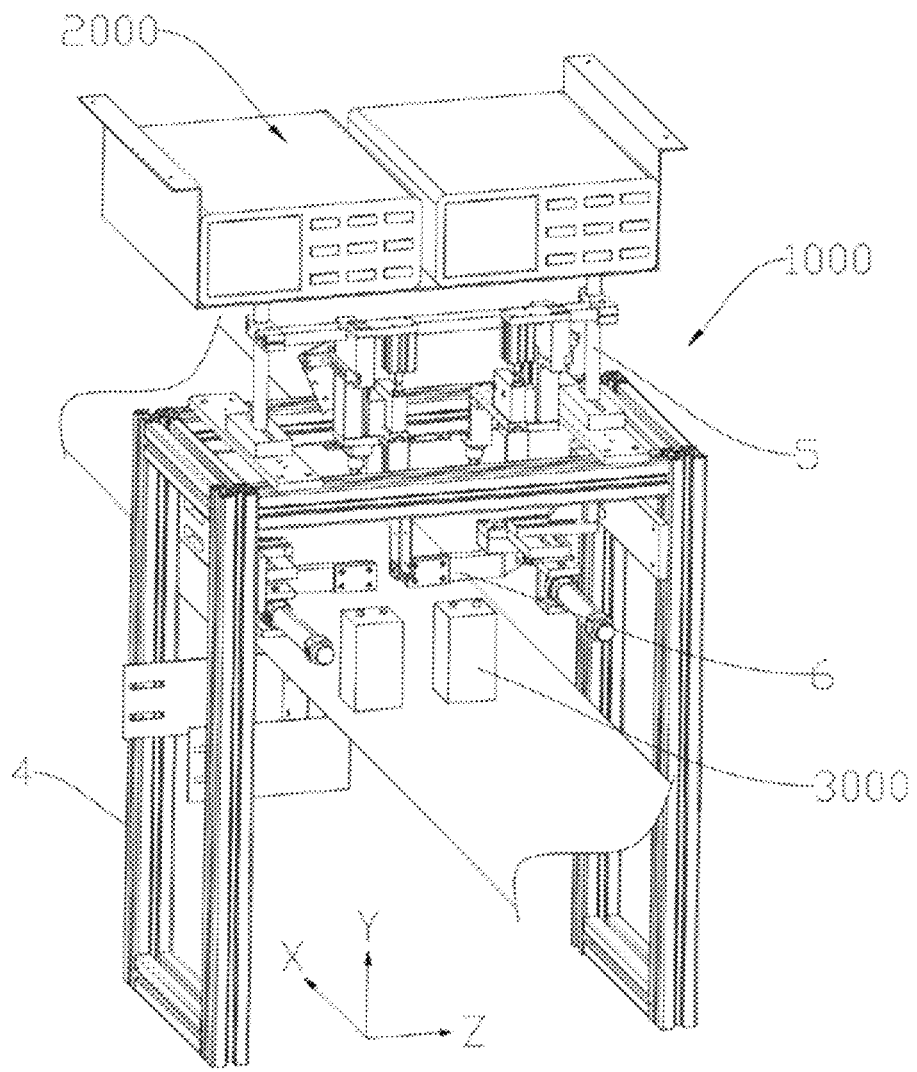
FIG. 1 is a schematic diagram of a battery internal resistance detecting device according to an embodiment of the present application.

For the objects, technical solutions and advantages of the embodiments of the present application to be clearer, the technical solutions in the embodiments of the present application will be clearly and completely described below in conjunction with the drawings in the embodiments of the present application, and it is apparent that the described embodiments are a part of the embodiments of the present application rather than all the embodiments. The assembly of the embodiments of the present application generally described and illustrated in the drawings herein can be arranged and designed in a variety of different configurations.

Accordingly, the following detailed description of the embodiments of the present application provided in the accompanying drawings is not intended to limit the claimed scope of the present application, but merely represents selected embodiments of the present application. Based on the embodiments in the present application, all other embodiments obtained by those of ordinary skill in the art without creative effort fall within the protection scope of the present application.

It should be noted that like reference numerals and letters denote similar items in the following figures, and therefore, once an item is defined in one figure, further definition and explanation for the item are not required in subsequent figures.

In the description of the present application, it is to be understood that, the orientation or positional relationships indicated by terms "central," "upper," "lower," "left," "right," "vertical," "horizontal," "inner," "outer", and the like are based on the orientation or positional relationships shown in the drawings or the orientation or positional relationships usually placed by the applied product, and are only for facilitating the description of the present application and simplifying the description, rather than indicating or implying that the apparatus or element referred to must have a particular orientation or be constructed and operated in a particular orientation, and therefore will not be interpreted as limiting the present application.

In addition, terms such as "horizontal" and "vertical" in the description of the present application do not mean that the components are required to be absolutely horizontal or overhanging, but may be slightly inclined. For example, "horizontal" only means that its direction is more horizontal than "vertical," and it does not mean that the structure must be completely horizontal, but may be slightly inclined.

In the description of the present application, it should be noted that the terms "arrange," "mount," "connect," and "connection" should be understood in a broad sense, unless otherwise explicitly specified or defined. For example, it may be a fixed connection, a detachable connection, or an integrated connection; it may be a mechanical connection or an electrical connection; and it may be a direct connection or an indirect connection through an intermediate medium, or may be a communication between the interior of two elements. For those of ordinary skill in the art, the specific meanings of the above terms in the present application may be understood according to specific circumstances.

A battery comprises a positive electrode and a negative electrode, and the battery is charged and discharged through the positive electrode and the negative electrode. When a current flows through the interior of the battery, there will generally be a certain resistance, and the resistance is an internal resistance of the battery. The internal resistance is an important factor affecting the power performance of the battery. When the internal resistance of the battery is too large, the battery itself consumes more power and generates higher heat. Excessive heat during use will lead to deterioration of the battery performance and decline in the battery performance. Therefore, the internal resistance of the battery is generally required to be as small as possible. A smaller internal resistance of the battery results in a less waste of electric energy, lower heat generated, and better performance of the battery.

Therefore, in the related art, it is often necessary to detect the internal resistance of the battery, so as to detect whether the internal resistance of the battery meets design requirements. A battery internal resistance detecting device generally has two probes. When performing battery internal resistance detection, it is necessary to connect one probe to a positive electrode of a battery and the other probe to a negative electrode of the battery. For batteries of different specifications, positions of positive electrodes and negative electrodes are set differently, so that distances between the positive electrodes and the negative electrodes are also different. In a scenario of batch detection (for example, on a battery production line), two probes of the battery internal resistance detecting device are generally fixed, and are only capable of being connected to a positive electrode and a negative electrode of a battery of one specification; as a result, only the internal resistance of a battery of one specification can be detected, and it is incapable of detecting internal resistances of batteries of different specifications.

In order to facilitate the detection of internal resistance of batteries of different specifications, the present application provides a technical solution. The battery internal resistance detecting device comprises a first probe and a second probe. The first probe is used for electrically connecting to a positive electrode of a battery, and the second probe is used for electrically connecting to a negative electrode of the battery, wherein a distance between the first probe and the second probe is adjustable. By setting the battery internal resistance detecting device to have an adjustable distance between the first probe and the second probe, the distance between the first probe and the second probe may be adjusted conveniently according to distances between the positive electrodes and the negative electrodes of the batteries of different specifications, so that the battery internal resistance detecting device is capable of detecting internal resistances of batteries of different specifications, thereby improving the applicability of the battery internal resistance detecting device.

The battery internal resistance detecting device provided in the present application may be mounted in a battery production system, for example, to perform internal resistance detection on batteries on a production line of the battery production system, so as to screen batteries whose internal resistances meet requirements. It should be noted that the battery internal resistance detecting device provided in the present application is not limited to be mounted in the battery production system, and may also be mounted in another device or system for detecting an internal resistance of the battery.

Figure 2:
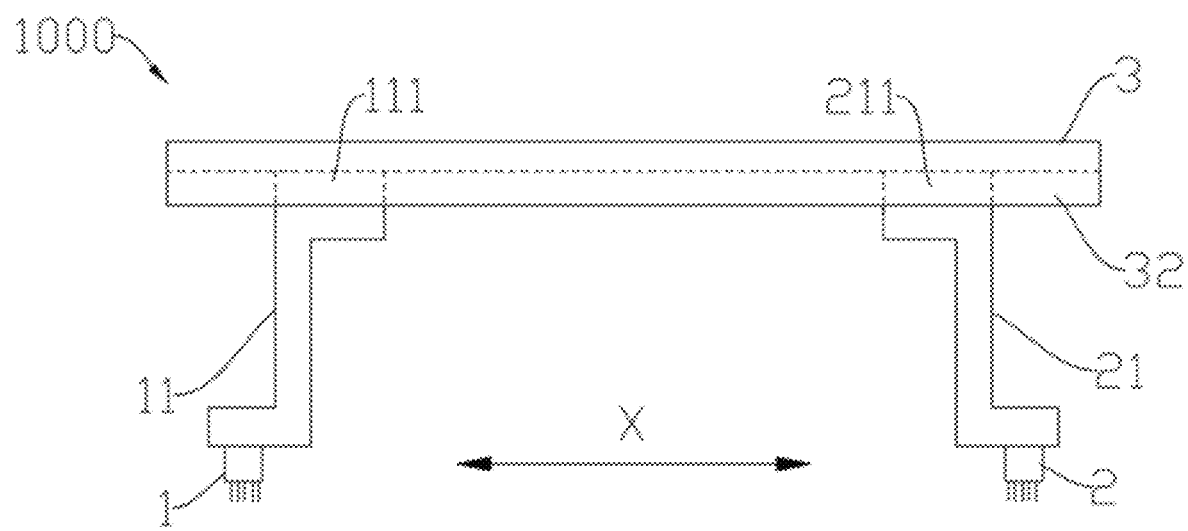
FIG. 2 is a schematic diagram of a first probe and a second probe according to an embodiment of the present application.

As shown in FIG. 1 and FIG. 2, the battery internal resistance detecting device 1000 comprises a first probe 1 and a second probe 2, the first probe 1 is used for electrically connecting to a positive electrode of the battery 3000, and the second probe 2 is used for electrically connecting to a negative electrode of the battery 3000, wherein a distance between the first probe 1 and the second probe 2 is adjustable.

Both the first probe 1 and the second probe 2 are made of a conductive material, such as a metal material.

The battery internal resistance detecting device 1000 is a device for detecting an internal resistance of the battery 3000, and generally comprises an internal resistance tester 2000. The first probe 1 and the second probe 2 are generally connected to the internal resistance tester 2000 by wires respectively. When the first probe 1 is electrically connected to the positive electrode of the battery 3000, and the second probe 2 is electrically connected to the negative electrode of the battery 3000, conduction between the internal resistance tester 2000 and the battery 3000 is realized, so that the battery is capable of detecting the internal resistance of the battery 3000 through the internal resistance tester 2000.

In the embodiment of the present application, by setting the distance between the first probe 1 and the second probe 2 to be adjustable, the distance between the first probe 1 and the second probe 2 may be adjusted conveniently according to a distance between the positive electrode and the negative electrode of the battery 3000, so that the battery internal resistance detecting device 1000 is capable of detecting internal resistances of batteries 3000 of different specifications, thereby improving the applicability of the battery internal resistance detecting device 1000.

According to some embodiments of the present application, as shown in FIG. 2, the battery internal resistance detecting device 1000 further comprises a first base 3, a first bracket 11, and a second bracket 21. The first bracket 11 is connected to the first base 3, and the first probe 1 is arranged on the first bracket 11. The second bracket 21 is connected to the first base 3 and arranged opposite to the first bracket 11 in a first direction X, and the second probe 2 is arranged on the second bracket 21. At least one of the first bracket 11 and the second bracket 21 is movable in the first direction X, so that the distance between the first probe 1 and the second probe 2 is adjustable.

The first bracket 11 and the second bracket 21 are components for mounting the first probe 1 and the second probe 2 respectively, wherein the first probe 1 is arranged on the first bracket 11, and the second probe 2 is arranged on the second bracket 21. By arranging the first bracket 11 and the second bracket 21 opposite to each other on the first base 3 in the first direction X, the first probe 1 and the second probe 2 are opposite to each other in the first direction X.

"At least one of the first bracket 11 and the second bracket 21 is movable in the first direction X" may be understood as that the first bracket 11 is movably connected to the first base 3 in the first direction X, and/or the second bracket 21 is movably connected to the first base 3 in the first direction X.

The first probe 1 and the second probe 2 are opposite in the first direction X, and at least one of the first bracket 11 and the second bracket 21 is movable in the first direction X, so that the first probe 1 and the second probe 2 are capable of being relatively close to or far away from each other in the first direction X, so as to adjust the distance between the first probe 1 and the second probe 2.

By moving the first bracket 11 and/or the second bracket 21 on the first base 3 in the first direction X, the distance adjustment between the two probes can be achieved, the overall structure is simple, and it is convenient to replace and maintain the probes.

Figure 3:
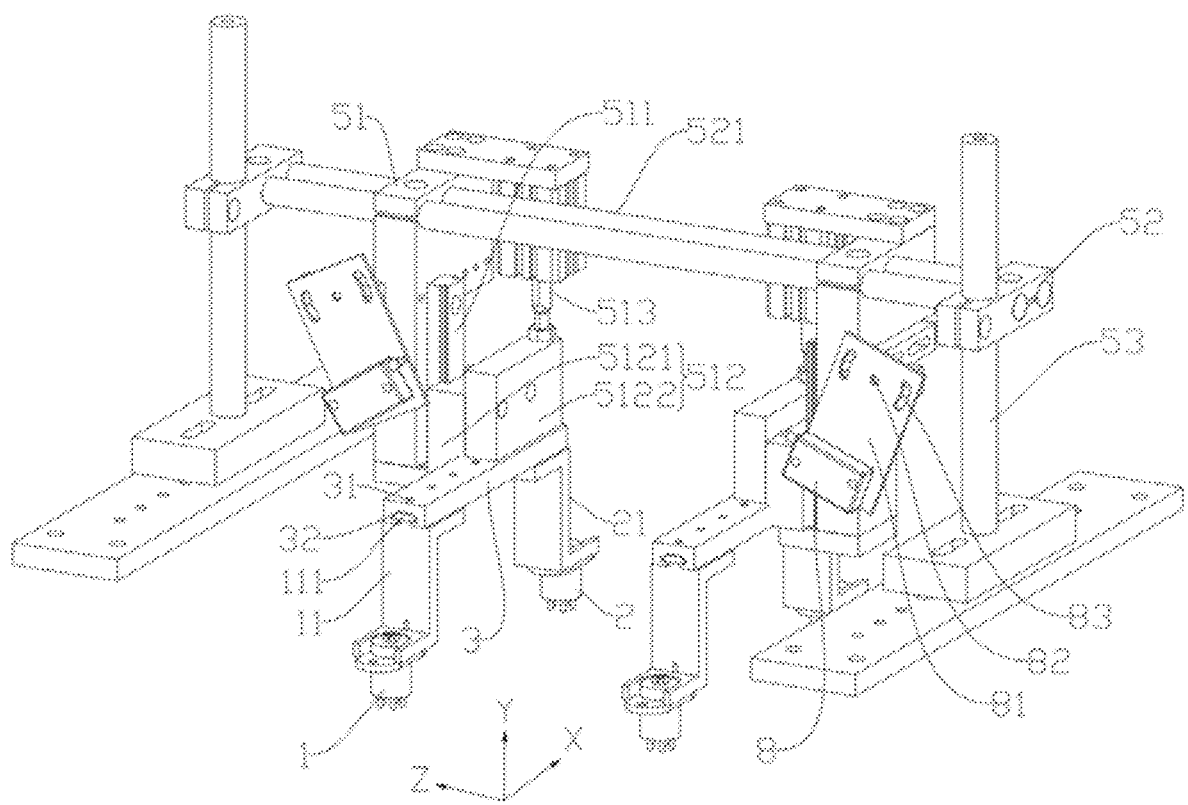
FIG. 3 is a schematic diagram of an adjusting apparatus according to an embodiment of the present application.

According to some embodiments of the present application, as shown in FIG. 2 and FIG. 3, the first base 3 has a plurality of through holes 31 arranged in the first direction X, and the battery internal resistance detecting device 1000 further comprises a first fixing member (not shown in the figure) and a second fixing member (not shown in the figure), the first bracket 11 is optionally connected to the plurality of through holes 31 through the first fixing member, and the second bracket 21 is optionally connected to the plurality of through holes 31 through the second fixing member.

The first fixing member and the second fixing member may be components for connection and fixing such as a screw and nut assembly and a bolt and nut assembly.

There are a plurality of structures of the first bracket 11 and the second bracket 21. For example, as shown in FIG. 2 and FIG. 3, the first bracket 11 and the second bracket 21 may be Z-shaped, one end of the Z shape is also provided with a through hole 31 (not shown in the figure), and the probe is mounted at the other end of the Z shape.

When the through hole 31 on the first bracket 11 corresponds to any one of the plurality of through holes 31 on the first base 3, the first fixing member simultaneously penetrates through the through hole 31 on the first bracket 11 and the through hole 31 on the first base 3, thereby realizing the connection of the first bracket 11 and the first base 3. By making the through hole 31 on the first bracket 11 correspond to different through holes 31 on the first base 3, the first bracket 11 is movably connected to the first base 3 in the first direction X.

Likewise, when the through hole 31 on the second bracket 21 corresponds to any one of the plurality of through holes 31 on the first base 3, the second fixing member simultaneously penetrates through the through hole 31 on the second bracket 21 and the through hole 31 on the first base 3, thereby realizing the connection of the second bracket 21 and the first base 3. By making the through hole 31 on the second bracket 21 correspond to different through holes 31 on the first base 3, the second bracket 21 is movably connected to the first base 3 in a second direction Y.

The first bracket 11 and the second bracket 21 are respectively fixed at different positions by passing the first fixing member and the second fixing member through different through holes 31 to realize the distance adjustment between the first bracket 11 and the second bracket 21, then realize the distance adjustment between the first probe 1 and the second probe 2, and further be capable of ensuring that the first probe 1 and the second probe 2 are stable at a certain distance, thereby avoiding displacement of the first probe 1 and the second probe 2, and ensuring that the first probe 1 and the second probe 2 are capable of being respectively connected to the positive electrode and the negative electrode of a battery 3000 to be detected.

According to some embodiments of the present application, as shown in FIG. 3, the first base 3 is provided with a chute 32 extending in the first direction X, and a plurality of through holes 31 are located at the bottom of the chute 32. The first bracket 11 is provided with a first protrusion 111, the first protrusion 111 is movably fitted in the chute 32, and the first fixing member passes through the first protrusion 111 and is optionally connected to the plurality of through holes 31. The second bracket 21 is provided with a second protrusion 211, the second protrusion 211 is movably fitted in the chute 32, and the second fixing member passes through the second protrusion 211 and is optionally connected to the plurality of through holes 31.

The bottom of the chute 32 refers to a surface of the chute 32 opposite to a groove mouth of the chute 32, and "a plurality of through holes 31 are located at the bottom of the chute 32" may be understood as that the plurality of through holes 31 are arranged at the bottom of the chute 32 in an extending direction of the chute 32.

The first protrusion 111 is a block-shaped protrusion structure on the first bracket 11, and the second protrusion 211 is a block-shaped protrusion structure on the second bracket 21.

The chute 32 may have various shapes, for example, a dovetail groove. The shape of the first protrusion 111 and the shape of the second protrusion 211 may be diversified, as long as they are adapted to the shape of the chute 32 and are capable of being slidably connected to the chute 32.

The first protrusion 111 and the second protrusion 211 are respectively movably embedded in the chute 32 to realize distance adjustment.

The first protrusion 111 is fixed by the first fixing member, and the second protrusion 211 is fixed by the second fixing member, so as to realize the fixed distance.

By arranging the first protrusion 111 on the first bracket 11 and arranging the second protrusion 211 on the second bracket 21 to fit the chute 32, it is convenient to adjust the distance by sliding the first bracket 11 and the second bracket 21, the structure is simple, and the operation is convenient. The first bracket 11 and the second bracket 21 are capable of being respectively fixed by the first fixing member and the second fixing member, so as to avoid the displacement of the first probe 1 and the second probe 2 and ensure the stability of the first probe 1 and the second probe 2. Furthermore, it is ensured that the first probe 1 and the second probe 2 are capable of being respectively connected to the positive electrode and the negative electrode of the battery 3000 to be detected.

According to some embodiments of the present application, as shown in FIG. 1 and FIG. 3, the battery internal resistance detecting device 1000 further comprises a frame body 4 and an adjusting apparatus 5, and the adjusting apparatus 5 is arranged on the frame body 4 and connected to the first base 3, so as to adjust a position of the first base 3 relative to the frame body 4.

The frame body 4 is a structure for fixing the battery internal resistance detecting device 1000. In some embodiments, the frame body 4 is further capable of being used for placing the battery 3000 or allowing the battery 3000 to move through.

The adjusting apparatus 5 is arranged on the frame body 4, and an actuating end of the adjusting apparatus 5 is connected to the first base 3 so as to change the position of the first base 3.

Batteries 3000 of different specifications may have different positions of positive electrodes and negative electrodes, and therefore, by adjusting the position of the first base 3, the position adjustment of the first probe 1 and the second probe 2 is capable of being achieved so that the position of the first probe 1 corresponds to the positive electrodes of the batteries 3000 of different specification, and the position of the second probe 2 corresponds to the negative electrodes of the batteries 3000 of different specifications, which further facilitates the detection of the internal resistances of the batteries 3000 of different specifications.

According to some embodiments of the present application, as shown in FIG. 3, the adjusting apparatus 5 comprises a second base 51, a first guide rail 511, a first slider 512, and a first driving member 513. The first guide rail 511 is arranged on the second base 51 and extends in a second direction Y, and the second direction Y is perpendicular to the first direction X. The first slider 512 is arranged on the first guide rail 511 and connected to the first base 3, and the first slider 512 is configured to be capable of moving along the first guide rail 511 to adjust a position of the first base 3 in the second direction Y. The first driving member 513 is used for driving the first slider 512 to move along the first guide rail 511.

The first guide rail 511 and the first slider 512 cooperate to realize sliding connection between the first base 3 and the second base 51. It can be understood that the first base 3 is capable of moving relative to the second base 51 in the second direction Y under the action of the first guide rail 511 and the first slider 512.

The first direction X may be a horizontal direction, and the second direction Y may be a vertical direction.

The first driving member 513 is arranged on the second base 51, an output end of the first driving member 513 is connected to the first slider 512, and the first driving member 513 drives the first slider 512 to move along the first guide rail 511, thereby driving the first base 3 to move in the second direction Y.

The first driving member 513 is any linear movement driving mechanism, for example, the first driving member 513 is an electric cylinder, a motor lead screw nut assembly, an air cylinder, and the like. For example, as shown in FIG. 3, the first driving member 513 is an air cylinder, a cylinder body of the air cylinder is connected to the second base 51, and a piston rod of the air cylinder is connected to the first slider 512.

By moving the first base 3 in the second direction Y, the first probe 1 and the second probe 2 are capable of approaching the battery 3000 in the second direction Y and respectively contacting with the positive electrode and the negative electrode of the battery 3000, or moving away from the battery 3000 in the second direction Y to be detached from the electrical connections with the positive electrode and the negative electrode of the battery 3000, so that it is convenient to place the battery 3000 at a set position or take the battery 3000 away at the set position, and it is further convenient to detect the internal resistance of the battery 3000.

It should be noted that, in some embodiments, the second direction Y may also be another horizontal direction perpendicular to the first direction X.

According to some embodiments of the present application, as shown in FIG. 3, the first slider 512 comprises a first part 5121 and a second part 5122, and the first part 5121 is connected to the first guide rail 511. The first base 3 has a plurality of through holes 31 arranged in the first direction XX. The battery internal resistance detecting device 1000 further comprises a third fixing member (not shown in the figure), and the second part 5122 is optionally connected to the plurality of through holes 31 through the third fixing member to adjust a position of the first base 3 in the first direction X.

The first part 5121 and the second part 5122 may be integrally formed, or may be connected as a whole after being formed separately. Optionally, the first part 5121 and the second part 5122 are formed separately, the first part 5121 is connected to the first guide rail 511, the second part 5122 is connected to the first base 3, and then the first part 5121 and the second part 5122 are connected as a whole by a screw, a rivet, or the like.

The second part 5122 is provided with a connecting hole (not shown in the figure), the connecting hole may be a through hole 31 or a blind hole, and an inner wall of the connecting hole may be provided with an internal thread or may be a smooth inner wall.

The third fixing member may be a component used for connection and fixing, such as a screw and a bolt.

In addition to connecting the first bracket 11 and the second bracket 21, the plurality of through holes 31 on the first base 3 are further capable of being used for connecting the second part 5122 of the first slider 512. For example, when the connecting hole on the second part 5122 corresponds to the through hole 31 on the first base 3, the third fixing member passes through the through hole 31 on the first base 3 and extends into the connecting hole on the second part 5122 to realize the connection of the first base 3 and the second part 5122.

By optionally connecting the second part 5122 of the first slider 512 to the plurality of through holes 31 through the third fixing member, the position of the first base 3 is capable of being adjusted relative to the first slider 512 in the first direction X. When the positions of the positive electrode and the negative electrode of the battery 3000 are different in the first direction X, the position of the first base 3 in the first direction X is capable of being adjusted so that the first probe 1 corresponds to the position of the positive electrode of the battery 3000, and the second probe 2 corresponds to the position of the negative electrode of the battery 3000.

According to some embodiments of the present application, as shown in FIG. 3, the adjusting apparatus 5 further comprises a third base 52 and a second guide rail 521. The second guide rail 521 is connected to the third base 52 and extends in a third direction Z. The third direction Z is perpendicular to the first direction X and the second direction Y, and the second base 51 is movably connected to the second guide rail 521 to adjust a position of the first base 3 in the third direction Z.

The second guide rail 521 is connected to the third base 52, and the second base 51 is movably connected to the second guide rail 521, so that the second base 51 is capable of moving relative to the third base 52 in the third direction Z, so that the first base 3 connected to the second base 51 is capable of moving relative to the third base 52 in the third direction Z, so that the first probe 1 and the second probe 2 on the first base 3 are capable of moving in the third direction Z.

Optionally, the second guide rail 521 is a slide bar, and the second base 51 comprises two parts connected at one end and separated at the other end. The second guide rail 521 slidably passes between the two parts of the second base 51, so that the second base 51 is capable of sliding in the second guide rail 521. In order to facilitate fixing the position of the second base 51 to position the first probe 1 and the second probe 2, in some embodiments, the second guide rail 521 may be clamped tightly by pressing the two parts of the second base 51 against each other, thereby fixing the second base 51. For example, the second guide rail 521 is clamped tightly by fastening the separated ends of the two parts of the second base 51 with a screw.

In an embodiment where the first direction X is a horizontal direction and the second direction Y is a vertical direction, the third direction Z is another horizontal direction, and the third direction Z is perpendicular to the first direction X. For example, the first direction X is a front-rear direction, the second direction Y is an up-down direction, and the third direction Z is a left-right direction.

When the positions of the positive electrode and the negative electrode of the battery 3000 are different in the third direction Z, the position of the first base 3 in the third direction Z is capable of being adjusted by moving the second base 51 in the second direction, so that the first probe 1 corresponds to the position of the positive electrode of the battery 3000, and the second probe 2 corresponds to the position of the negative electrode of the battery 3000.

According to some embodiments of the present application, as shown in FIG. 3, the adjusting apparatus 5 further comprises a third guide rail 53, the third guide rail 53 is arranged on the frame body 4 and extends in the second direction Y, and the third base 52 is movably connected to the third guide rail 53.

There are a plurality of manners to connect the third guide rail 53 and the third base 52, as long as the position adjustment of the third base 52 is capable of being achieved and the position of the third base 52 is capable of being fixed. Optionally, the third guide rail 53 is a slide bar, and the third base 52 comprises two parts connected at one end and separated at the other end. The third guide rail 53 slidably passes between the two parts of the third base 52, so that the third base 52 is capable of sliding in the second guide rail 521. In order to facilitate fixing the position of the third base 52 to position the first probe 1 and the second probe 2, in some embodiments, the second guide rail 521 may be clamped tightly by pressing the two parts of the third base 52 against each other, thereby fixing the third base 52. For example, the third guide rail 53 is clamped tightly by fastening the separated ends of the two parts of the third base 52 with a screw.

When the specifications of the batteries 3000 are different, the batteries 3000 may have different sizes in the second direction Y. By arranged the third base 52 on the third guide rail 53, when the third base 52 is moved, the second base 51 connected to the third base 52 is capable of moving in the second direction Y, and driving the first base 3, the first probe 1, and the second probe 2 to move in the second direction Y, so as to be capable of adjusting the positions of the first probe 1 and the second probe 2 in the second direction Y in advance, thereby further being convenient to detect batteries 3000 of different specifications.

In addition, initial positions of the first probe 1 and the second probe 2 are also capable of being adjusted by moving the third base 52 to ensure that distances from the first probe 1 to the positive electrodes of the batteries 3000 of different specifications are consistent, and distances from the second probe 2 to the negative electrodes of the batteries 3000 of different specifications are consistent, so that moving distances of the first probe 1 and the second probe 2 remain unchanged when detecting the batteries 3000 of different specifications. Therefore, the first base 3 may be driven by the first driving member 513 with a fixed stroke to move in the second direction Y. When detecting the batteries 3000 of different specifications, there is no need to replace different first driving members 513, which facilitates detecting and reduces costs.

According to some embodiments of the present application, as shown in FIG. 1, the frame body 4 is provided with a channel 41 for the battery 3000 to pass through. The battery internal resistance detecting device 1000 further comprises: a stopping apparatus 6 arranged on the frame body 4 and located in the channel 41, the stopping apparatus 6 being used for stopping the battery 3000 at a preset position.

As shown in FIG. 1, in some embodiments, the frame body 4 is a door-shaped frame structure, and the channel 41 is formed in the middle of the door-shaped structure for the battery 3000 to pass through. The frame body 4 may be erected above a conveyor belt of a production line of the batteries 3000, so that the batteries 3000 is capable of passing through the channel 41, so that the first probe 1 and the second probe 2 arranged on the frame body 4 are capable of being adjusted under the action of the adjusting apparatus 5 to be connected to the positive electrode and the negative electrode of the battery 3000 in the channel 41.

The stopping apparatus 6 is an apparatus for intercepting the battery 3000 passing through the channel 41. The stopping apparatus 6 is arranged on a moving path of the battery 3000, so that the battery 3000 to be detected is capable of stopping moving when it reaches a preset position, thereby positioning the battery 3000, so as to ensure that the first probe 1 and the second probe 2 are capable of being connected to the positive electrode and the negative electrode of the battery 3000 stopped at the preset position. After the inspection is completed, the stopping apparatus 6 gives way to the moving path of the battery 3000 to release the battery 3000 that has been detected.

For example, the channel 41 runs through the frame body 4 in the first direction X, and the conveyor belt of the production line of the batteries 3000 extends in the first direction X and passes through the channel 41.

By arranging the channel 41 for the battery 3000 to pass through on the frame body 4, it is convenient to erect the frame body 4 on a production line of the batteries 3000, so that the battery internal resistance detecting device 1000 can perform batch detection on the batteries 3000 on the production line of the batteries 3000. During the detection, the battery 3000 on the production line is intercepted by the stopping apparatus 6, so that the battery 3000 is stopped and positioned at a preset position, so that the first probe 1 and the second probe 2 are connected to the positive electrode and negative electrode of the battery 3000 to detect the internal resistance of the battery 3000.

Figure 4:
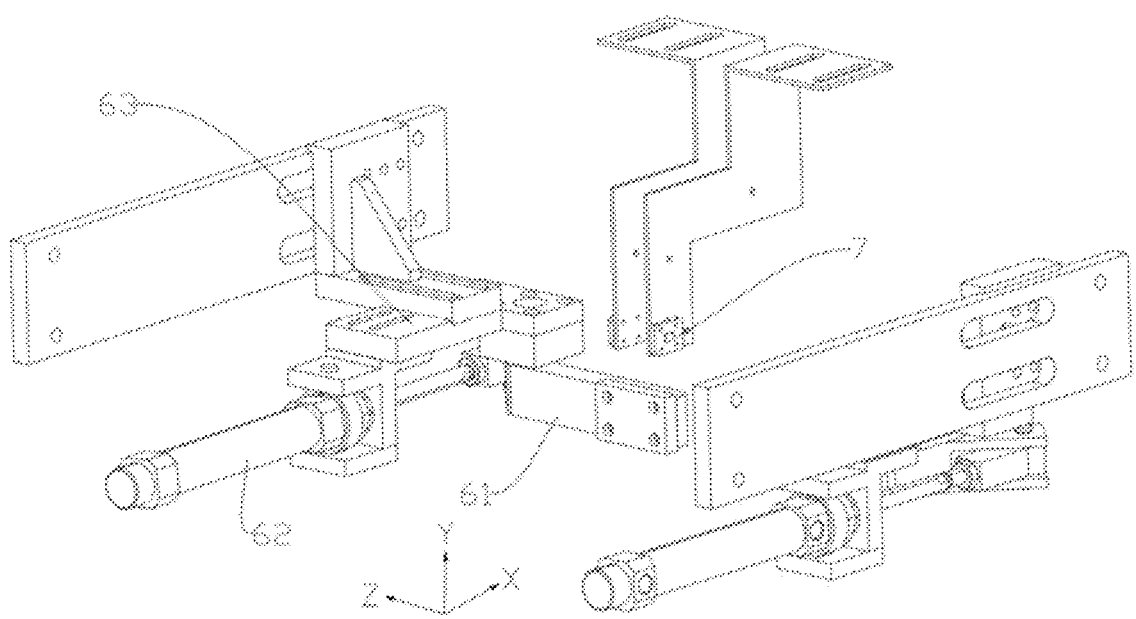
FIG. 4 is a schematic diagram of a blocking member of a stopping apparatus according to an embodiment of the present application in an extended state.

According to some embodiments of the present application, as shown in FIG. 4, the stopping apparatus 6 comprises: a blocking member 61 and a second driving member 62. The blocking member 61 is movably arranged on the frame body 4 and has a retracted state and an extended state, the blocking member 61 is capable of stopping the battery 3000 at the preset position in the extended state. The second driving member 62 is arranged on the frame body 4, and the second driving member 62 is used for driving the blocking member 61 to move to switch between the retracted state and the extended state.

Figure 5:
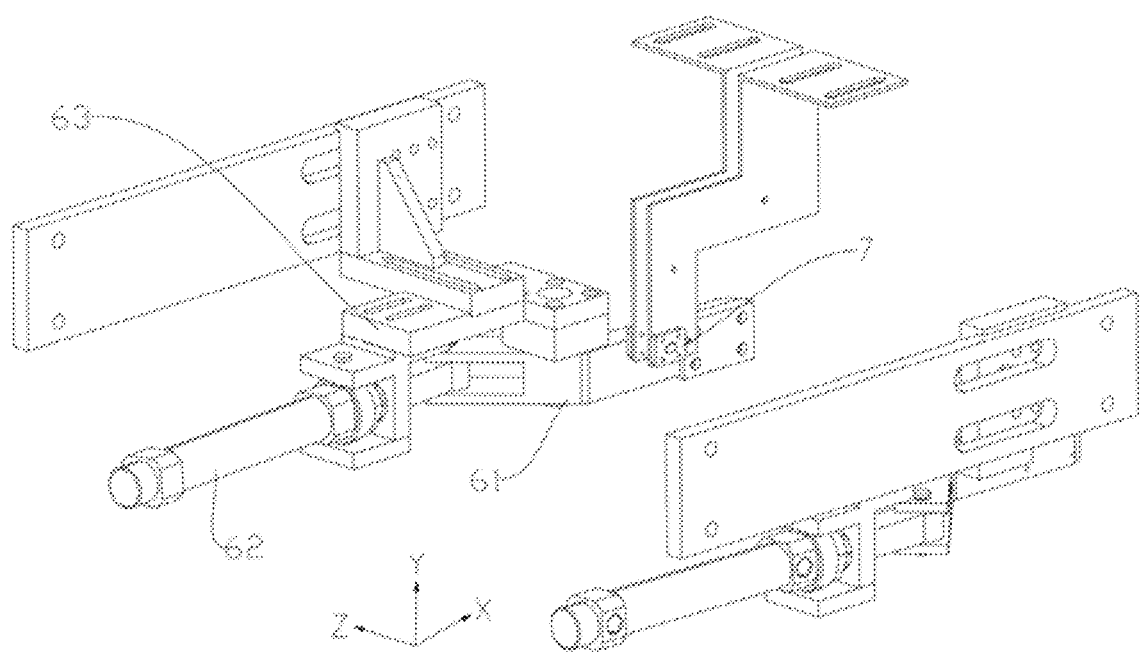
FIG. 5 is a schematic diagram of a blocking member of a stopping apparatus according to an embodiment of the present application in a retracted state.

The blocking member 61 is a component for intercepting and positioning the battery 3000. In some embodiments, the blocking member 61 is rotatably connected to the frame body 4. As shown in FIG. 4, when the blocking member 61 is rotated to extend substantially in the third direction Z, the blocking member 61 is in the stretched state to intercept the battery 3000 moving in the first direction X. As shown in FIG. 5, when the blocking member 61 is rotated to extend substantially in the first direction X, it is in the retracted state to allow the battery 3000 to move in the first direction X. The second driving member 62 may be of various types, such as a motor, an electric cylinder, and an air cylinder, as long as it is capable of driving the blocking member 61 to rotate. In this embodiment, the second driving member 62 is an electric cylinder, a cylinder body of the electric cylinder is connected to the frame body 4, a piston rod of the electric cylinder is connected to the blocking member 61, and the piston rod of the electric cylinder stretches and retracts to drive the blocking member 61 to rotate. For the convenience of connection, as shown in FIG. 4, the battery internal resistance detecting device 1000 further comprises a first mounting base 63, the first mounting base 63 is connected to the frame body 4, and a middle part of the blocking member 61 is connected to the first mounting base 63 through a rotating shaft. The second driving member 62 is mounted on the first mounting base 63 and has an output end connected to one end of the blocking member 61. The second driving member 62 acts to drive the blocking member 61 to rotate around its rotating shaft, so that the other end of the blocking member 61 blocks or releases the battery 3000.

In some other embodiments, the blocking member 61 may also be configured to be capable of moving linearly in the third direction Z or stretching and retracting in the third direction Z, and the second driving member 62 is used for driving the blocking member 61 to move or stretch and retract, thereby realizing blocking or releasing the battery 3000.

By arranging the second driving member 62 to drive the blocking member 61 to move, the battery 3000 is automatically blocked and released, and the detection efficiency is improved.

According to some embodiments of the present application, as shown in FIG. 4 and FIG. 5, the battery internal resistance detecting device 1000 further comprises a position detecting apparatus 7. The position detecting apparatus 7 is arranged on the frame body 4 and located in the channel 41, the position detecting apparatus 7 is used for detecting a position of the battery 3000, and is configured to send a first signal when the battery 3000 reaches a preset position. The stopping apparatus 6 is configured to act in response to the first signal to stop the battery 3000.

The position detecting apparatus 7 is an apparatus used for detecting the position of the battery 3000, and the position detecting apparatus 7 may optionally be an ultrasonic ranging sensor, a laser ranging sensor, an infrared ranging sensor, or the like, as long as it is capable of detecting the position of the battery 3000.

When detecting that there is a battery 3000 at the preset position, the position detecting apparatus 7 sends a first signal, and the stopping apparatus 6 acts in response to the first signal to change from the retracted state to the stretched state, thereby realizing the stopping of the battery 3000.

Through the cooperation of the position detecting apparatus 7 and the stopping apparatus 6, automatic stop is further realized, thereby avoiding missed detection and improving the detection efficiency.

According to some embodiments of the present application, as shown in FIG. 3, the battery internal resistance detecting device 1000 further comprises a scanning apparatus 8. The scanning apparatus 8 is used for scanning an identification on the battery 3000 to read information of the battery 3000.

The battery 3000 is generally provided with an identification (such as a QR code and a bar code), which is equivalent to an ID card of the battery 3000, and is used for recording the information of each battery 3000 in processing steps, so as to be capable of identifying the battery 3000, tracing the processing process and controlling the quality of the battery 3000.

The scanning apparatus 8 is a device for identifying the identification of the battery 3000, and is used for reading the information recorded in the identification of the battery 3000 undergoing the internal resistance detection, so as to be capable of matching the detection result with the battery 3000.

By arranging the scanning apparatus 8 to read the information of the battery 3000, a detection result is capable of matching the battery 3000, thereby preventing the battery 3000 with an unqualified internal resistance detection result from flowing out.

In order to facilitate the mounting of the scanning apparatus 8, as shown in FIG. 3, the battery internal resistance detecting device 1000 further comprises a second mounting base 81, the scanning apparatus 8 is connected to the second mounting base 81, and the second mounting base 81 is connected to the second base 51, so that the scanning apparatus 8 is capable of adjust a position in the second direction Y and the third direction Z. Batteries 3000 of different specifications may have different positions of arranging identifications. By adjusting the position of the scanning apparatus 8, it is convenient for the scanning apparatus 8 to scan the identifications on the batteries 3000 of different specifications.

Optionally, the scanning apparatus 8 is configured to be capable of rotating relative to the second base 51 to adjust an angle of the scanning apparatus 8 and further ensure that the scanning apparatus 8 is capable of scanning the identifications on the batteries 3000 of different specifications. For example, the second mounting base 81 is provided with a shaft rod 82, and the second mounting base 81 is rotatably connected to the second base 51 through the shaft rod 82.

In order to ensure the stable angle of the scanning apparatus 8, an arc-shaped hole 83 is further provided on the second mounting base 81. An extending direction of the arc-shaped hole 83 is arc-shaped, and a position of the center of the arc-shaped hole 83 overlaps a position of the shaft rod 82. A screw hole corresponding to the position of the arc-shaped hole 83 is arranged on the second base 51. The battery internal resistance detecting device 1000 further comprises a screw (not shown in the figure), the screw passes through the arc-shaped hole 83 and fits the screw hole, and when the screw is loosened, the screw is capable of moving in the arc-shaped hole 83, so that the second mounting base 81 is capable of rotating around the shaft rod 82 to adjust the angle of the scanning apparatus 8, and the second mounting base 81 is capable of being fixed when the screw is tightened to ensure the stability of the angle of the scanning apparatus 8.

According to some embodiments of the present application, the embodiments of the present application further provide a battery 3000 production system, and the battery 3000 production system comprises the battery internal resistance detecting device 1000 described in any of the foregoing embodiments. Optionally, the battery internal resistance detecting device 1000 is arranged on a production line of the battery 3000 production system, so as to detect an internal resistance of the battery 3000 on the production line.

In the battery 3000 production system provided in the embodiment of the present application, the battery internal resistance detecting device 1000 arranged therein is capable of detecting internal resistances of batteries 3000 of different specifications, and the battery 3000 production system is capable of being adapted to producing batteries 3000 of different specifications.

According to some embodiments of the present application, as shown in FIG. 1 to FIG. 5, the embodiment of the present application provides a battery internal resistance detecting device 1000. The battery internal resistance detecting device 1000 comprises a frame body 4, an adjusting apparatus 5, a first base 3, a first bracket 11, a second bracket 21, a first probe 1, and a second probe 2. The frame body 4 is used for being erected on a production line carrying a battery 3000, and the frame body 4 forms a channel 41 extending in a first direction X (that is, a front-rear direction), and the production line passes through the channel 41, so that the battery 3000 is capable of moving through the frame body 4 in the first direction X. The adjusting apparatus 5 is arranged on the frame body 4 and is located above the channel 41. An actuating end of the adjusting apparatus 5 is connected to the first base 3. The first bracket 11 and the second bracket 21 are respectively connected to the first base 3 movably in the first direction X. The first probe 1 is arranged on the first bracket 11, and the second probe 2 is arranged on the second bracket 21. A distance between the first probe 1 and the second probe 2 is adjusted by moving the first bracket 11 and/or the second bracket 21 on the first base 3. The position of the first base 3 on the frame body 4 is adjusted by the adjusting apparatus 5, thereby realizing adjustment of the positions of the first probe 1 and the second probe 2. For example, when the battery 3000 moves to a preset position in the channel 41 in the first direction X, the adjusting apparatus 5 drives the first probe 1 and the second probe 2 to move in a second direction Y (an up-down direction), thereby being close to the battery 3000 in the channel 41 and respectively connecting a positive electrode and a negative electrode of the battery 3000 to realize detection of an internal resistance of the battery 3000. When the specification of the battery 3000 to be detected needs to be changed, the positions of the positive electrode and the negative electrode of the battery 3000 are changed. At this time, the first bracket 11 and/or the second bracket 21 may be moved to adjust the distance between the first probe 1 and the second probe 2, so that the distance between the first probe 1 and the second probe 2 is the same as the distance between the positive electrode and the negative electrode of the battery 3000. At the same time, positions of the first probe 1 and the second probe 2 in the first direction X and in a third direction Z (a left-right direction) can further be adjusted by the adjusting apparatus 5, so that the first probe 1 and the second probe 2 are capable of respectively corresponding to the positive electrode and the negative electrode of the battery 3000 at the preset position, thereby ensuring that the first probe 1 and the second probe 2, when moving in the second direction Y, are capable of accurately contacting with the positive electrode and the negative electrode of the battery 3000 respectively. Optionally, each battery internal resistance detecting device 1000 comprises two groups of assemblies having an adjustable distance and consisting of the first base 3, the first bracket 11, the second bracket 21, the first probe 1, and the second probe 2. The two groups of assemblies are arranged at an interval in the third direction Z, so as to be capable of performing the internal resistance detection on two rows of batteries 3000 on the production line.

The above are only preferred embodiments of the present application, and are not intended to limit the present application. For those skilled in the art, the present application may have various modifications and changes. Any modifications, equivalent replacements, improvements, etc. made within the spirit and principle of the present application shall be comprised within the scope of protection of the present application.

What is claimed is:

1. A battery internal resistance detecting device, comprising:
    a first probe configured to electrically connect to a positive electrode of a battery;
    a second probe configured to electrically connect to a negative electrode of the battery;
    a first base;
    a first bracket connected to the first base, the first probe being arranged on the first bracket; and
    a second bracket connected to the first base and arranged opposite to the first bracket in a first direction, the second probe being arranged on the second bracket,
    wherein at least one of the first bracket and the second bracket is movable in the first direction, so that a distance between the first probe and the second probe is adjustable.

2. The battery internal resistance detecting device according to claim 1, wherein the first base has a plurality of through holes arranged in the first direction;
    the battery internal resistance detecting device further comprises:
    a first fixing structure, the first bracket being optionally connected to the plurality of through holes through the first fixing structure; and
    a second fixing structure, the second bracket being optionally connected to the plurality of through holes through the second fixing structure.

3. The battery internal resistance detecting device according to claim 2, wherein the first base is provided with a chute extending in the first direction, and the plurality of through holes are located at the bottom of the chute;
    the first bracket is provided with a first protrusion, which is movably fitted in the chute, and through which the first fixing structure optionally is connected to the plurality of through holes; and
    the second bracket is provided with a second protrusion, which is movably fitted in the chute, and through which the second fixing structure is optionally connected to the plurality of through holes.

4. The battery internal resistance detecting device according to claim 1, wherein the battery internal resistance detecting device further comprises:
    a frame body; and
    an adjuster arranged on the frame body and connected to the first base, so as to adjust a position of the first base relative to the frame body.

5. The battery internal resistance detecting device according to claim 4, wherein the adjuster comprises:
    a second base;
    a first guide rail arranged on the second base and extending in a second direction, the second direction being perpendicular to the first direction;
    a first slider arranged on the first guide rail and connected to the first base, the first slider being configured to be capable of moving along the first guide rail to adjust a position of the first base in the second direction; and
    a first driver configured to drive the first slider to move along the first guide rail.

6. The battery internal resistance detecting device according to claim 5, wherein the first slider comprises a first part and a second part, the first part is connected to the first guide rail; the first base has a plurality of through holes arranged in the first direction; and
    the battery internal resistance detecting device further comprises:
    a third fixing structure, the second part being optionally connected to the plurality of through holes through the third fixing structure, so as to adjust a position of the first base in the first direction.

7. The battery internal resistance detecting device according to claim 5, wherein the adjuster further comprises:
    a third base; and
    a second guide rail connected to the third base and extending in a third direction, the third direction being perpendicular to the first direction and the second direction, and the second base being movably connected to the second guide rail, so as to adjust a position of the first base in the third direction.

8. The battery internal resistance detecting device according to claim 7, wherein the adjuster further comprises:
    a third guide rail arranged on the frame body and extending in the second direction, the third base being movably connected to the third guide rail.

9. The battery internal resistance detecting device according to claim 4, wherein the frame body is provided with a channel for the battery to pass through; and
    the battery internal resistance detecting device further comprises:
    a stopper arranged on the frame body and located in the channel, the stopper configured to stop the battery at a preset position.

10. The battery internal resistance detecting device according to claim 9, wherein the stopper comprises:
    a blocking structure movably arranged on the frame body and having a retracted state and an extended state, the blocking structure being capable of stopping the battery at the preset position in the extended state; and
    a second driver arranged on the frame body, the second driver configured to drive the blocking structure to move to switch between the retracted state and the extended state.

11. The battery internal resistance detecting device according to claim 9, wherein the battery internal resistance detecting device further comprises:
    a position detector arranged on the frame body and located in the channel, the position detector configured to detect a position of the battery, and send a first signal when the battery reaches a preset position; and
    the stopper is configured to act in response to the first signal to stop the battery.

12. The battery internal resistance detecting device according to claim 1, wherein the battery internal resistance detecting device further comprises:
    a scanner to scan an identification on the battery to read information of the battery.

13. A battery production system, comprising the battery internal resistance detecting device according to claim 1.

* * * * *